United States Patent
Tsukamoto

(10) Patent No.: US 10,748,741 B2
(45) Date of Patent: Aug. 18, 2020

(54) X-RAY ANALYZER AND METHOD FOR CORRECTING COUNTING RATE

(71) Applicant: JEOL Ltd., Tokyo (JP)

(72) Inventor: Kazunori Tsukamoto, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/536,562

(22) Filed: Aug. 9, 2019

(65) Prior Publication Data

US 2020/0058464 A1    Feb. 20, 2020

(30) Foreign Application Priority Data

Aug. 16, 2018    (JP) .................................. 2018-153074

(51) Int. Cl.
  *G01N 23/22*    (2018.01)
  *H01J 37/244*    (2006.01)
  *H01J 37/252*    (2006.01)

(52) U.S. Cl.
  CPC .......... *H01J 37/244* (2013.01); *H01J 37/252* (2013.01); *H01J 2237/2561* (2013.01)

(58) Field of Classification Search
  CPC ........... G01N 2223/076; G01N 23/223; G01N 23/225; G01N 23/2076; G01N 2223/303; G01N 2223/304; G01N 2223/402; G01N 23/2206; G01N 23/2252; G01T 1/17; G01T 1/36; G01T 1/16; H01J 2237/244; H01J 37/244; H01J 37/256

(Continued)

(56) References Cited

U.S. PATENT DOCUMENTS 4,288,692 A * 9/1981 Schamber ............ G01N 23/225
                                                                      250/310
5,774,522 A * 6/1998 Warburton .............. G01T 1/171
                                                                      250/370.06

(Continued)

FOREIGN PATENT DOCUMENTS

EP        048753 A2   5/1992
JP       5076012 B1   8/2012
WO    2013017425 A1   2/2013

OTHER PUBLICATIONS

Extended European Search Report issued in EP19191938.0 dated Nov. 26, 2019.

*Primary Examiner* — David A Vanore
(74) *Attorney, Agent, or Firm* — The Webb Law Firm

(57) ABSTRACT

An X-ray analyzer includes: an X-ray detector that detects an X-ray emitted from a specimen and outputs a signal having a step that has a height corresponding to energy of the X-ray; a pulse generation circuit that converts the signal output from the X-ray detector into a first pulse signal; a pulse-width setting circuit that sets a pulse width; a pulse-width conversion circuit that converts a pulse width of the first pulse signal into the pulse width set by the pulse-width setting circuit to form a second pulse signal; a pulse-height discriminator that discriminates the second pulse signal according to a pulse height of the second pulse signal; a counting circuit that calculates a counting rate of the discriminated second pulse signal; and a counting-loss correction processing unit that corrects the counting rate. The counting-loss correction processing unit corrects the counting rate based on the pulse width.

6 Claims, 3 Drawing Sheets

(58) Field of Classification Search
USPC .... 250/395, 397, 214 R, 310, 336.1, 370.06, 250/374, 399; 378/44, 90, 19, 45, 53, 70, 378/71, 86, 91
See application file for complete search history.

(56) References Cited

U.S. PATENT DOCUMENTS

| | | | | |
|---|---|---|---|---|
| 5,949,847 | A * | 9/1999 | Terada | G01N 23/221 378/86 |
| 6,121,623 | A * | 9/2000 | Ochiai | H01J 37/256 250/397 |
| 6,404,847 | B1 * | 6/2002 | Ueki | G01N 23/223 378/44 |
| 6,675,106 | B1 * | 1/2004 | Keenan | G01J 3/28 702/194 |
| 8,618,495 | B2 * | 12/2013 | De Geronimo | H03K 5/1532 250/395 |
| 10,593,072 | B2 * | 3/2020 | Katoh | G01T 1/36 |
| 2007/0206721 | A1 * | 9/2007 | Tkaczyk | A61B 6/032 378/19 |
| 2013/0294577 | A1 * | 11/2013 | Kataoka | G01N 23/223 378/44 |
| 2014/0048717 | A1 * | 2/2014 | Tanaka | G01T 1/16 250/395 |
| 2016/0076935 | A1 * | 3/2016 | Daerr | G01T 1/171 250/214 R |
| 2017/0184519 | A1 * | 6/2017 | Sako | G01N 23/223 |
| 2019/0033469 | A1 * | 1/2019 | Brambilla | G01T 1/17 |
| 2019/0064084 | A1 * | 2/2019 | Ullom | G01N 23/223 |
| 2020/0058464 | A1 * | 2/2020 | Tsukamoto | H01J 37/252 |

* cited by examiner

X-RAY ANALYZER AND METHOD FOR CORRECTING COUNTING RATE

CROSS-REFERENCE TO RELATED APPLICATION

This application claims priority to Japanese Patent Application No. 2018-153074 filed Aug. 16, 2018, the disclosure of which is hereby incorporated by reference in its entirety.

BACKGROUND OF THE INVENTION

Field of the Invention

The present invention relates to an X-ray analyzer and a method for correcting a counting rate.

Description of Related Art

A known electron probe micro analyzer (EPMA) is of a type that irradiates the surface of a specimen with an electron beam and then disperses and detects a characteristic X-ray emitted from the specimen to make an analysis of the specimen.

In an electron probe micro analyzer, a wavelength-dispersive X-ray spectrometer (WDS) is generally installed. The wavelength-dispersive X-ray spectrometer uses, for example, a proportional counter as an X-ray detector.

In the wavelength-dispersive X-ray spectrometer, a characteristic X-ray emitted from a specimen is dispersed by an analyzing crystal and then detected by the X-ray detector. The signal detected by the X-ray detector is converted into a pulse signal. The pulse height of the pulse signal is proportional to the energy of the characteristic X-ray. The pulse signal is transmitted to a pulse-height discriminator. In the pulse-height discriminator, a pulse signal within the range of a predetermined pulse height is discriminated. The discriminated pulse signal is transmitted to a counting circuit. In the counting circuit, the discriminated pulse signal is counted to calculate a counting rate (the number of pulses per unit time, cps (counts per second)). By the calculation of the counting rate of the pulse signal, the acquisition of the counting rate of the X-ray is allowed.

Here, since the X-ray detector has dead time, the counting loss of the pulse signal is caused. Therefore, a counting rate $N_0$ is corrected by using the following formula (see, for example, Japanese Patent No. 5,076,012).

$$N = \frac{N_0}{1 - \tau N_0} \quad (1)$$

Note, however, that N represents a corrected counting rate, $N_0$ represents a measured counting rate, and $\tau$ represents dead time.

Here, when the X-ray is incident on the proportional counter used as the X-ray detector, detection gas is ionized to generate a multiplicity of electrons and ions due to an electron avalanche phenomenon. These electrons and ions move in the detection gas and reach a core wire, the frame electrode of the detector, or the like to return to a normal state. Movement time until the electrons return to the normal state after the ionization is about several tens of nanoseconds to several hundreds of nanoseconds. However, movement time until the ions return to the normal state after the ionization could be about several seconds.

Therefore, when an X-ray having strong intensity is successively incident, a subsequent X-ray is incident before the ionized detection gas returns to the normal state, that is, before a state in which the X-ray is detectable. Thus, the detection gas capable of being ionized reduces, and the width and the pulse height of the pulse signal reduce even if the X-ray having the same energy is incident.

Further, in the proportional counter, the width and the pulse height of the pulse signal change according to the energy of the detected X-ray.

From the above reasons, the dead time of the X-ray detector changes. When the dead time changes like this, the accurate correction of the counting rate is not allowed even with the above formula (1).

SUMMARY OF THE INVENTION

According to a first aspect of the invention, there is provided an X-ray analyzer including:
  an X-ray detector that detects an X-ray emitted from a specimen and outputs a signal a step of which has a height corresponding to energy of the X-ray;
  a pulse generation unit that converts the signal output from the X-ray detector into a first pulse signal;
  a pulse-width setting unit that sets a pulse width;
  a pulse-width conversion unit that converts a pulse width of the first pulse signal into the pulse width set by the pulse-width setting unit to form a second pulse signal;
  a pulse-height discriminator that discriminates the second pulse signal according to a pulse height of the second pulse signal;
  a counting unit that calculates a counting rate of the discriminated second pulse signal; and
  a correction processing unit that corrects the counting rate calculated by the counting unit,
  the correction processing unit correcting the counting rate based on the pulse width set by the pulse-width setting unit.

According to a second aspect of the invention, there is provided a method of correcting a counting rate of an X-ray in an X-ray analyzer equipped with an X-ray detector that detects an X-ray emitted from a specimen and outputs a signal a step of which has a height corresponding to energy of the X-ray, the method including:
  converting the signal output from the X-ray detector into a first pulse signal;
  setting a pulse width;
  converting a pulse width of the first pulse signal into the set pulse width to form a second pulse signal;
  discriminating the second pulse signal according to a pulse height of the second pulse signal;
  calculating a counting rate of the discriminated second pulse signal; and
  correcting the counting rate of the second pulse signal,
  in the step of correcting the counting rate of the second pulse signal, the counting rate being corrected based on the pulse width set in the step of setting the pulse width.

DETAILED DESCRIPTION OF THE EMBODIMENT

Figure 1:
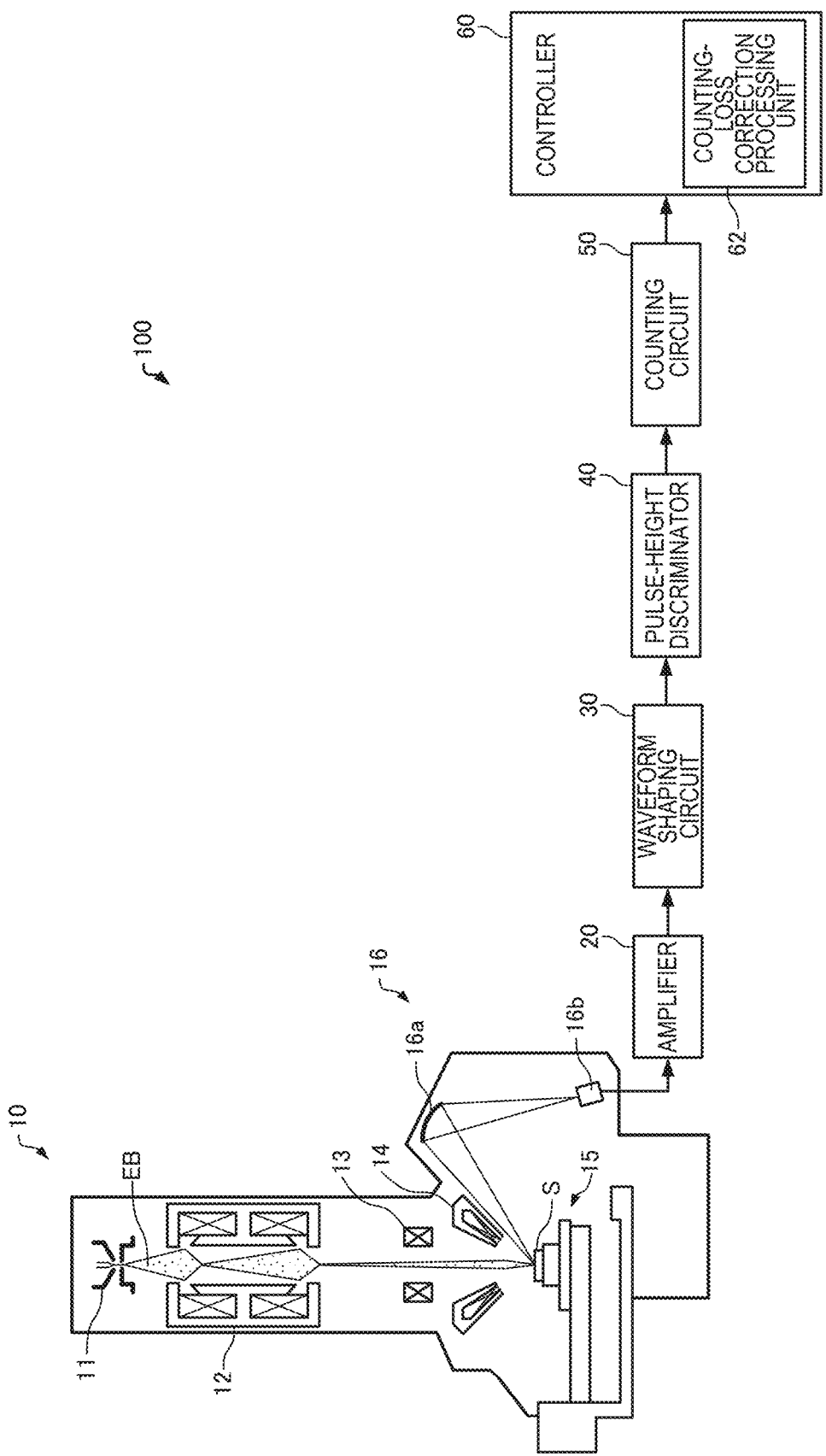
FIG. 1 is a diagram illustrating a configuration of an X-ray analyzer according to an embodiment of the invention.

According to an embodiment of the invention, there is provided an X-ray analyzer including:
- an X-ray detector that detects an X-ray emitted from a specimen and outputs a signal a step of which has a height corresponding to energy of the X-ray;
- a pulse generation unit that converts the signal output from the X-ray detector into a first pulse signal;
- a pulse-width setting unit that sets a pulse width;
- a pulse-width conversion unit that converts a pulse width of the first pulse signal into the pulse width set by the pulse-width setting unit to form a second pulse signal;
- a pulse-height discriminator that discriminates the second pulse signal according to a pulse height of the second pulse signal;
- a counting unit that calculates a counting rate of the discriminated second pulse signal; and
- a correction processing unit that corrects the counting rate calculated by the counting unit,
- the correction processing unit correcting the counting rate based on the pulse width set by the pulse-width setting unit.

In the X-ray analyzer, the pulse width of a pulse signal is converted into a pulse width set by the pulse-width setting unit in the pulse-width conversion unit. In addition, a counting rate is corrected based on the pulse width set by the pulse-width setting unit in the correction processing unit. Therefore, dead time is capable of being made constant, and the calculation of a counting rate with high accuracy is allowed in the X-ray analyzer.

According to an embodiment of the invention, there is provided a method of correcting a counting rate of an X-ray in an X-ray analyzer equipped with an X-ray detector that detects an X-ray emitted from a specimen and outputs a signal a step of which has a height corresponding to energy of the X-ray, the method including:
- converting the signal output from the X-ray detector into a first pulse signal;
- setting a pulse width;
- converting a pulse width of the first pulse signal into the set pulse width to form a second pulse signal;
- discriminating the second pulse signal according to a pulse height of the second pulse signal;
- calculating a counting rate of the discriminated second pulse signal; and
- correcting the counting rate,
- in the step of correcting the counting rate, the counting rate being corrected based on the pulse width set in the step of setting the pulse width.

In the method for correcting a counting rate, the pulse width of a pulse signal is converted into a set pulse width. In addition, a counting rate is corrected based on the set pulse width. Therefore, dead time is capable of being made constant, and the calculation of a counting rate with high accuracy is allowed in the method for correcting a counting rate.

Embodiments of the invention are described in detail below with reference to the drawings. Note that the following embodiments do not unduly limit the scope of the invention as stated in the claims. In addition, all of the elements described below are not necessarily essential requirements of the invention.

1. CONFIGURATIONS OF X-RAY ANALYZER

First, an X-ray analyzer according to an embodiment of the invention will be described with reference to the drawings. Here, a case in which the X-ray analyzer is an electron probe micro analyzer (EPMA) will be described.

Figure 2:
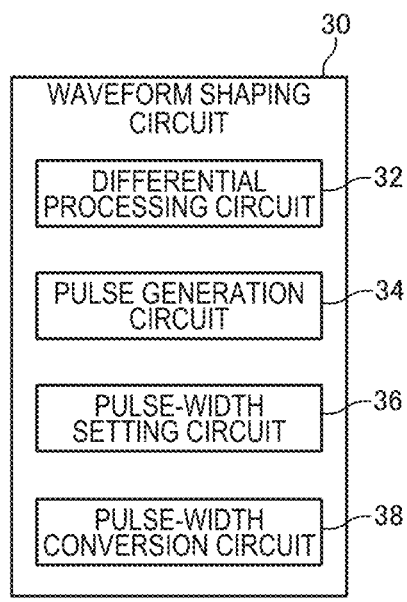
FIG. 2 is a diagram illustrating a configuration of a waveform shaping circuit.

FIG. 1 is a diagram illustrating the configurations of an X-ray analyzer 100 according to an embodiment of the invention. FIG. 2 is a diagram illustrating the configurations of a waveform shaping circuit 30.

The X-ray analyzer 100 includes a body unit 10, an amplifier 20, the waveform shaping circuit 30, a pulse-height discriminator 40 (an example of a pulse-height discrimination unit), a counting circuit 50 (an example of a counting unit), and a controller 60 including a counting-loss correction processing unit 62 (an example of a correction processing unit).

The body unit 10 includes an electron gun 11, a focusing lens 12, a deflector 13, an objective lens 14, a specimen stage 15, and a wavelength-dispersive X-ray spectrometer 16.

The electron gun 11 generates 11 an electron beam EB. The electron gun 11 emits the electron beam EB accelerated with a predetermined acceleration voltage to a specimen S.

The focusing lens 12 is a lens used to focus the electron beam EB emitted from the electron gun 11.

The deflector 13 deflects the electron beam EB two-dimensionally. By the input of a scanning signal to the deflector 13 via a control circuit (not shown), the electron beam EB (electron probe) focused by the focusing lens 12 and the objective lens 14 is allowed to scan the specimen S.

The objective lens 14 is a lens used to focus the electron beam EB on the specimen S and irradiate the specimen S with the electron beam EB serving as an electron probe.

The specimen stage 15 is allowed to support the specimen S. The specimen S is placed on the specimen stage 15. Although not shown in the figure, the specimen stage 15 is equipped with a movement mechanism used to move the specimen S. By the movement of the specimen S through the specimen stage 15, an analysis position (a position onto which the electron beam EB (the electron probe) is irradiated) on the specimen S is allowed to move.

The wavelength-dispersive X-ray spectrometer 16 includes a spectroscopic element (analyzing crystal) 16a and an X-ray detector 16b. In the wavelength-dispersive X-ray spectrometer 16, a characteristic X-ray generated from the specimen S is dispersed by the spectroscopic element 16a, and then the dispersed X-ray is detected by the X-ray detector 16b.

The spectroscopic element 16a is, for example, a crystal used to perform dispersion of light according to the diffraction phenomenon of an X-ray. The X-ray detector 16b includes, for example, a proportional counter. The X-ray detector 16b detects the characteristic X-ray emitted from the specimen S and outputs a signal of which the height of a step corresponds to the energy of the X-ray.

Note that the body unit 10 may be further equipped with a secondary-electron detector, an energy-dispersive X-ray analyzer, or the like.

Figure 3:
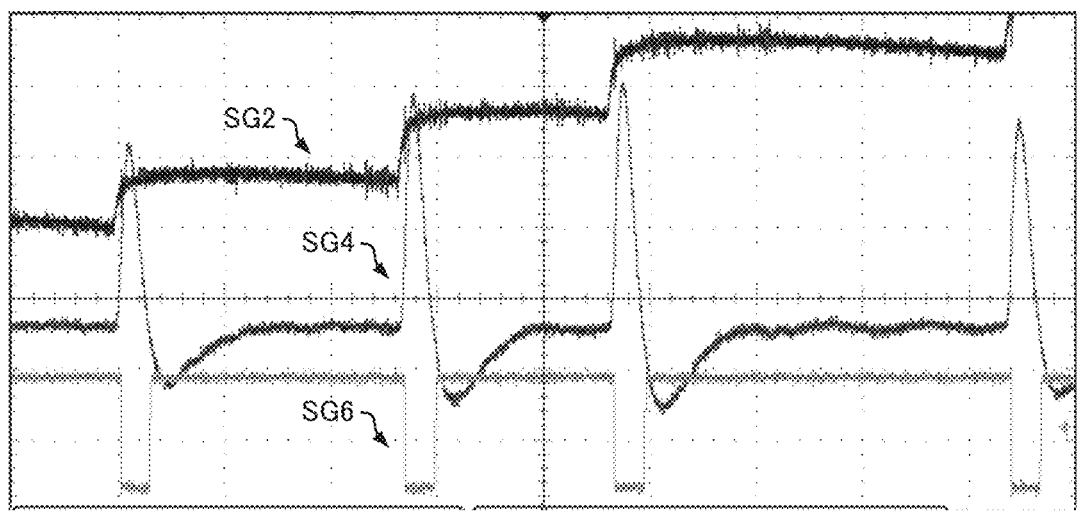
FIG. 3 is a diagram illustrating an output signal, a differential signal, and a pulse signal of an X-ray detector.

FIG. 3 is a diagram illustrating an output signal SG2, a differential signal SG4, and a pulse signal SG6 of the X-ray detector 16b.

The amplifier 20 is a circuit used to amplify an output signal SG2 of the X-ray detector 16b. The signal SG2 amplified by the amplifier 20 is transmitted to the waveform shaping circuit 30.

As illustrated in FIG. 2, the waveform shaping circuit 30 includes a differential processing circuit 32, a pulse generation circuit 34 (an example of a pulse generation unit), a pulse-width setting circuit 36 (an example of a pulse-width setting unit), and a pulse-width conversion circuit 38 (an example of a pulse-width conversion unit).

The differential processing circuit 32 differentiates the signal SG2 amplified by the amplifier 20 and outputs the differentiated signal as a differential signal SG4. The differential signal SG4 is transmitted to the pulse generation circuit 34.

The pulse generation circuit 34 converts the differential signal SG4 into a pulse signal SG6. The pulse height of the pulse signal SG6 is proportional to, for example, the energy of a characteristic X-ray.

The pulse-width setting circuit 36 sets a pulse width (in units of time). After the pulse width is set by the pulse-width setting circuit 36, the pulse-width conversion circuit 38 converts the pulse width of the pulse signal SG6 into the pulse width set by the pulse-width setting circuit 36. Further, after the pulse width is set by the pulse-width setting circuit 36, a counting rate is corrected by the counting-loss correction processing unit 62 by using time corresponding to the pulse width set by the pulse-width setting circuit 36 as dead time.

The pulse-width conversion circuit 38 converts the pulse width of the pulse signal SG6 output from the pulse generation circuit 34 into the pulse width set by the pulse-width setting circuit 36.

Figure 4:
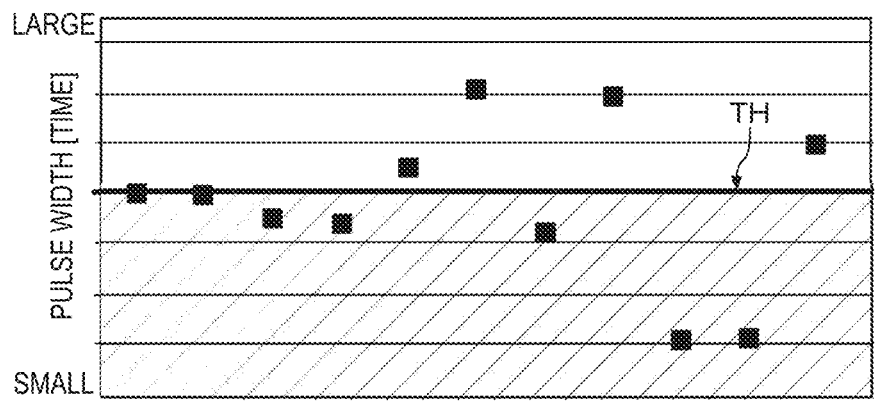
FIG. 4 is a diagram for describing processing of a pulse-width conversion circuit.
Figure 5:
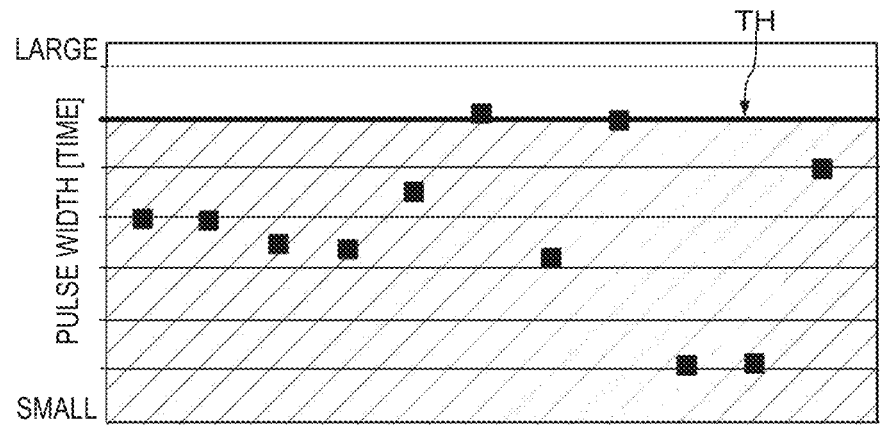
FIG. 5 is a diagram for describing processing of a pulse-width conversion circuit.

FIGS. 4 and 5 are diagrams for describing the processing of the pulse-width conversion circuit 38.

When the pulse width of a pulse signal SG6 is less than or equal to a pulse width TH (also called a "setting pulse width TH") set by the pulse-width setting circuit 36 as illustrated in FIG. 4, the pulse-width conversion circuit 38 converts the pulse width of the pulse signal SG6 into a setting pulse width TH. On the other hand, when the pulse width of the pulse signal SG6 is larger than the setting pulse width TH, the pulse-width conversion circuit 38 outputs the pulse signal SG6 as it is without converting the pulse width.

For example, if the maximum value of the pulse width of the pulse signal SG6 is calculated in advance, the maximum value is allowed to be set as the setting pulse width TH as illustrated in FIG. 5. The pulse width changes according to the type of a characteristic X-ray. Therefore, if the relationship between the number of X-rays and the number of counting losses is found by using the characteristic X-ray with which the pulse width becomes maximum, the calculation of the maximum value of the pulse width is allowed.

The pulse-width setting circuit 36 sets preset time as the setting pulse width TH. Note that the pulse-width setting circuit 36 may have information items on a plurality of pulse widths and set one selected from among the information items on the plurality of pulse widths as the setting pulse width TH. Further, when information on a pulse width is input from the controller 60, the pulse-width setting circuit 36 may set the pulse width specified from the information on the pulse width as the setting pulse width TH.

The pulse-width conversion circuit 38 converts the pulse width of the pulse signal SG6 into the setting pulse width TH according to the above processing, and then transmits the pulse signal to the pulse-height discriminator 40.

The pulse-height discriminator 40 discriminates the pulse signal from the pulse-width conversion circuit 38 according to a pulse height. The pulse-height discriminator 40 discriminates and outputs a pulse signal having a pulse height within the range of a set pulse height. A pulse signal having a pulse height outside the range of the set pulse height is not output from the pulse-height discriminator 40. The discriminated pulse signal is transmitted to the counting circuit 50.

The counting circuit 50 counts the discriminated pulse signal to calculate the counting rate of the pulse signal. The unit of the counting rate is cps (counts per second). From the counting rate of the pulse signal, the counting rate of an X-ray is obtained.

The controller 60 controls the respective units of the X-ray analyzer 100. The controller 60 includes, for example, a central processing unit (CPU) and a storage device (such as a random access memory (RAM) and a read only memory (ROM)). The controller 60 causes the CPU to run a program stored in the storage device to perform various calculation processing and various control processing. The controller 60 includes the counting-loss correction processing unit 62.

The counting-loss correction processing unit 62 corrects the counting rate of the pulse signal calculated by the counting circuit 50 based on the pulse width (setting pulse width TH) set by the pulse-width setting circuit 36. The counting-loss correction processing unit 62 uses the following formula (2) to correct the counting rate calculated by the counting circuit 50.

$$N = \frac{N_0}{1 - \tau' N_0} \quad (2)$$

Note that N represents a corrected counting rate. Further, $N_0$ represents a counting rate calculated by the counting circuit 50. Further, $\tau'$ represents dead time, and the dead time $\tau'$ is equal to the setting pulse width TH.

When the setting pulse width TH is set by the pulse-width setting circuit 36, the counting-loss correction processing unit 62 corrects the counting rate $N_0$ by using the above formula (2) with the dead time $\tau'$ set at time corresponding to the setting pulse width TH, that is, $\tau'$=TH.

2. OPERATION OF X-RAY ANALYZER

Next, the operation of the X-ray analyzer 100 will be described.

In the X-ray analyzer 100, an electron beam EB emitted from the electron gun 11 is focused by the focusing lens 12 and the objective lens 14 and then irradiated onto a specimen S. Thus, a characteristic X-ray is emitted from the specimen S. The characteristic X-ray having been emitted from the specimen S is dispersed by the spectroscopic element 16a, and the dispersed X-ray is detected by the X-ray detector 16b.

After detection of the X-ray by the X-ray detector 16b, a signal SG2 of which the height of a step corresponds to the X-ray is output from the X-ray detector 16b. The signal SG2 is amplified by the amplifier 20 and then transmitted to the waveform shaping circuit 30.

The signal SG2 having been amplified by the amplifier 20 is differentiated by the differential processing circuit 32 to be a differential signal SG4, and the differential signal SG4 is transmitted to the pulse generation circuit 34. The differential signal SG4 is converted into a pulse signal SG6 by the pulse generation circuit 34. The pulse height of the pulse signal SG6 corresponds to the energy of the detected X-ray. The pulse width of the pulse signal SG6 is converted by the pulse-width conversion circuit 38 into a pulse width (setting pulse width TH) set by the pulse-width setting circuit 36.

When the pulse width of the pulse signal SG6 is less than or equal to the setting pulse width TH at this time, the pulse width of the pulse signal SG6 is converted into the setting pulse width TH by the pulse-width conversion circuit 38. On the other hand, when the pulse width of the pulse signal SG6 is larger than the pulse width TH, the conversion of the pulse width of the pulse signal SG6 is not performed by the pulse-width conversion circuit 38 (see FIG. 4).

Note that when the setting pulse width TH is set at the maximum value of the pulse width (see FIG. 5), the pulse widths of all the pulse signals SG6 are converted into the setting pulse width TH by the pulse-width conversion circuit 38.

The pulse signal of which the pulse width has been converted by the pulse-width conversion circuit 38 is discriminated by the pulse-height discriminator 40, and only a pulse signal within the range of a predetermined pulse height is output. The pulse signal having been discriminated by the pulse-height discriminator 40 is counted by the counting circuit 50 to calculate a counting rate $N_0$. Information on the counting rate $N_0$ having been calculated by the counting circuit 50 is transmitted to the counting-loss correction processing unit 62.

The counting rate $N_0$ is corrected by the counting-loss correction processing unit 62 by using the above formula (2). At this time, time corresponding to the setting pulse width TH is used as dead time $\tau'$ (TH=$\tau'$). Thus, the counting rate $N_0$ is corrected, and the acquisition of a counting rate N is allowed.

The calculation of the counting rate N with high accuracy is allowed by the above processing. A reason for the calculation of the counting rate N with high accuracy will be described below.

For example, when a region having a high counting rate and a region having a low counting rate coexist in map analysis, dead time fluctuates in the X-ray detector 16b (proportional counter). In such a case, high accuracy is not obtained even if a counting rate is corrected by using the above formula (1).

On the other hand, the pulse width of a pulse signal is converted into a pulse width TH by the pulse-width conversion circuit 38 in the X-ray analyzer 100. Therefore, since dead time $\tau'$ is capable of being made constant (setting pulse width TH) in the above formula (2) when a counting rate is corrected by the counting-loss correction processing unit 62, the calculation of the counting rate with high accuracy is allowed.

3. FEATURES

The X-ray analyzer 100 has, for example, the following features.

The X-ray analyzer 100 includes: the X-ray detector 16b that detects an X-ray emitted from a specimen S and outputs a signal SG2 of which the height of a step corresponds to the energy of the X-ray; the pulse generation circuit 34 that converts the output signal SG2 of the X-ray detector 16b into a pulse signal SG6 (first pulse signal); the pulse-width setting circuit 36 that sets a pulse width; the pulse-width conversion circuit 38 that converts the pulse width of the pulse signal SG6 (first pulse signal) into the pulse width (setting pulse width TH) set by the pulse-width setting circuit 36 to form a second pulse signal; the pulse-height discriminator 40 that discriminates the second pulse signal according to the pulse height of the second pulse signal; the counting circuit 50 that calculates a counting rate from the discriminated second pulse signal; and the counting-loss correction processing unit 62 that corrects the counting rate of the X-ray calculated by the counting circuit 50. Further, the counting-loss correction processing unit 62 corrects the counting rate based on the pulse width (setting pulse width TH) set by the pulse-width setting circuit 36.

As described above, the pulse width of a pulse signal is converted into a setting pulse width TH by the pulse-width conversion circuit 38 in the X-ray analyzer 100. In addition, since a counting rate is corrected by the counting-loss correction processing unit 62 based on the setting pulse width TH to correct the counting rate, dead time $\tau'$ is capable of being made constant. Accordingly, the calculation of a counting rate with high accuracy is allowed in the X-ray analyzer 100.

4. MODIFIED EXAMPLES

Note that the invention is not limited to the embodiments described above but is capable of implementing various modifications within the spirit of the invention.

4.1. First Modified Example

For example, the wavelength-dispersive X-ray spectrometer 16 may have a plurality of spectroscopic elements 16a in the X-ray analyzer 100. For example, a plurality of analyzing crystals having different crystal surface intervals may be used as the spectroscopic elements 16a. Thus, the detection of an X-ray in a wide wavelength range is allowed.

In this case, the pulse-width setting circuit 36 sets a pulse width according to each of the types of the spectroscopic elements 16a. That is, the pulse-width setting circuit 36 is capable of setting up a plurality of setting pulse widths TH corresponding to the plurality of spectroscopic elements 16a. Thus, the correction of a counting rate with high accuracy is allowed.

Here, dead time is also different between the plurality of the different types of spectroscopic elements 16a. Therefore, when a common setting pulse width TH is used for the plurality of the different types of the spectroscopic elements 16a, the correction of a counting rate with high accuracy is not allowed. On the other hand, since a pulse width is set according to each of the types of the spectroscopic elements 16a in the X-ray analyzer 100, the correction of a counting rate with high accuracy is allowed.

For example, the X-ray analyzer 100 has a database in which information items on the types of the spectroscopic elements 16a and setting pulse widths TH most suitable for the types of the spectroscopic elements 16a are associated with each other. When information items on the types of the spectroscopic elements 16a are input from the controller 60, the pulse-width setting circuit 36 searches for the database and sets a pulse width according to each of the types of the spectroscopic elements 16a.

4.2. Second Modified Example

As described in, for example, the first modified example, the wavelength-dispersive X-ray spectrometer 16 may have a plurality of spectroscopic elements 16a in the X-ray analyzer 100. In addition, the wavelength-dispersive X-ray spectrometer 16 may have a plurality of X-ray detectors 16b (proportional counters).

In this case, the pulse-width setting circuit 36 sets a pulse width according to each of the combinations of the spectroscopic elements 16a and the X-ray detectors 16b. That is, the pulse-width setting circuit 36 is capable of setting up a plurality of setting pulse widths TH corresponding to the combinations of the spectroscopic elements 16a and the X-ray detectors 16b. Thus, the correction of a counting rate with high accuracy is allowed.

Here, dead time is also different when the combinations between the spectroscopic elements 16a and the X-ray detectors 16b are different. Therefore, when a common setting pulse width TH is used for the plurality of the combinations of the spectroscopic elements 16a and the X-ray detectors 16b, the correction of a counting rate with high accuracy is not allowed. On the other hand, in the X-ray analyzer 100, since a pulse width is set according to each of the combinations between the spectroscopic elements 16a and the X-ray detectors 16b, the correction of a counting rate with high accuracy is allowed.

For example, the X-ray analyzer 100 has a database in which information items on the combinations of the types of the spectroscopic elements 16a and the X-ray detectors 16b and setting pulse widths TH most suitable for the combinations are associated with each other. When information items on the combinations are input from the controller 60, the pulse-width setting circuit 36 searches for the database and sets a pulse width according to each of the combinations.

4.3. Third Modified Example

For example, a case in which the X-ray detector 16b includes a proportional counter in the X-ray analyzer 100 is described above. However, the X-ray detector 16b may include a detector such as a semiconductor detector.

The above-described embodiments and modifications are examples and the invention is not limited thereto. For example, the embodiments and the modifications may be combined appropriately.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. An X-ray analyzer comprising:
   an X-ray detector that detects an X-ray emitted from a specimen and outputs a signal having a step that has a height corresponding to energy of the X-ray;
   a pulse generation circuit that converts the signal output from the X-ray detector into a first pulse signal;
   a pulse-width setting circuit that sets a pulse width;
   a pulse-width conversion circuit that converts a pulse width of the first pulse signal into the pulse width set by the pulse-width setting circuit to form a second pulse signal;
   a pulse-height discriminator that discriminates the second pulse signal according to a pulse height of the second pulse signal;
   a counting circuit that calculates a counting rate of the discriminated second pulse signal; and
   a controller that corrects the counting rate calculated by the counting circuit,
   wherein the controller corrects the counting rate based on the pulse width set by the pulse-width setting circuit.

2. The X-ray analyzer according to claim 1, wherein the X-ray detector includes a proportional counter.

3. The X-ray analyzer according to claim 1, further comprising:
   a plurality of spectroscopic elements that disperse the X-ray, wherein
   the pulse-width setting circuit sets the pulse width according to each of types of the spectroscopic elements.

4. The X-ray analyzer according to claim 1, further comprising:
   a plurality of spectroscopic elements that disperse the X-ray, wherein
   the X-ray analyzer is provided with a plurality of X-ray detectors, and
   the pulse-width setting circuit sets the pulse width according to each of combinations of the spectroscopic elements and the X-ray detectors.

5. The X-ray analyzer according to claim 1, wherein
   the controller corrects the counting rate calculated by the counting circuit by using time corresponding to the pulse width set by the pulse-width setting circuit as dead time.

6. A method of correcting a counting rate of an X-ray in an X-ray analyzer equipped with an X-ray detector that detects an X-ray emitted from a specimen and outputs a signal having a step that has a height corresponding to energy of the X-ray, the method comprising:
   converting the signal output from the X-ray detector into a first pulse signal;
   setting a pulse width;
   converting a pulse width of the first pulse signal into the set pulse width to form a second pulse signal;
   discriminating the second pulse signal according to a pulse height of the second pulse signal;
   calculating a counting rate of the discriminated second pulse signal; and
   correcting the counting rate of the second pulse signal,
   wherein, in the step of correcting the counting rate of the second pulse signal, the counting rate is corrected based on the pulse width set in the step of setting the pulse width.

* * * * *